(12) United States Patent
Codama

(10) Patent No.: US 6,339,291 B1
(45) Date of Patent: Jan. 15, 2002

(54) ORGANIC ELECTROLUMINESCENT DEVICE, AND ITS FABRICATION METHOD

(75) Inventor: Mitsufumi Codama, Ibaraki (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/460,435

(22) Filed: Dec. 14, 1999

Related U.S. Application Data

(63) Continuation of application No. PCT/JP98/01652, filed on Apr. 10, 1998.

(51) Int. Cl.⁷ .............................................. H05B 33/00
(52) U.S. Cl. ........................ 313/506; 313/504; 313/505; 313/112
(58) Field of Search .................... 213/506, 500, 213/502, 504, 505, 509, 112; 428/917

(56) References Cited

U.S. PATENT DOCUMENTS 6,140,766 A * 10/2000 Okada et al. ........... 313/505 X

FOREIGN PATENT DOCUMENTS

| JP | 2-65091 | 3/1990 |
|---|---|---|
| JP | 3-250583 | 11/1991 |
| JP | 3-274694 | 12/1991 |
| JP | 4-51494 | 2/1992 |
| JP | 4-249095 | 9/1992 |
| JP | 6-132083 | 5/1994 |
| JP | 9-134787 | 5/1997 |
| JP | 9-161970 | 6/1997 |

* cited by examiner

Primary Examiner—Ashok Patel
(74) Attorney, Agent, or Firm—Oblon, Spivak, McClelland, Maier & Neustadt, P.C.

(57) ABSTRACT

The invention is directed to an organic EL device with a flattened first electrode, and a method of fabricating the same. After an ITO film 11 serving as the first electrode is formed on a glass substrate 10, a combined flattening and leveling film 12 is formed and patterned to form a combined flattening and leveling film 12a. In addition, the ITO film 11 is over-etched to form an ITO film 11a together with an undercut portion 15. After a flattening film 14 or an insulating film is coated all over the surface, a large portion of the flattening film 14 and the flattening and leveling film 12a are removed to allow an insulating film 14a formed in the undercut portion 15 to remain at the same thickness as the ITO film 11a.

2 Claims, 6 Drawing Sheets

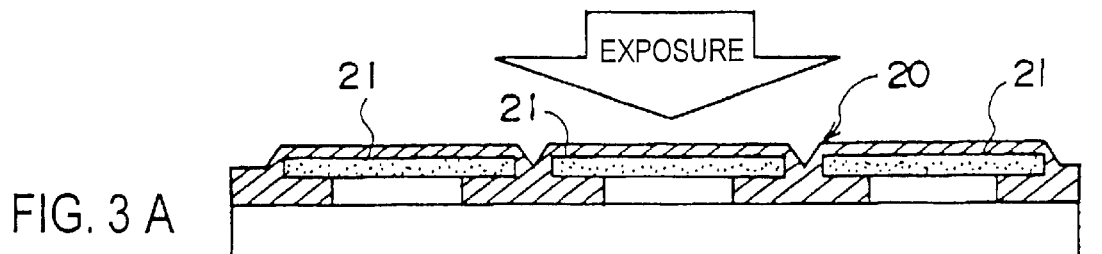
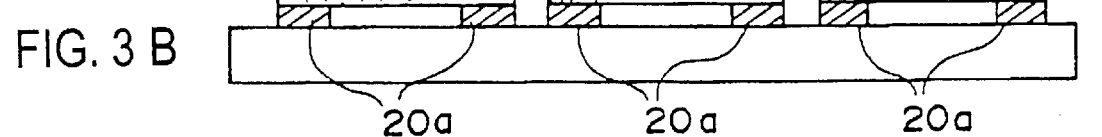
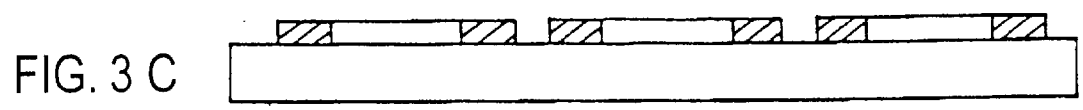
FIG. 3 A
FIG. 3 B
FIG. 3 C
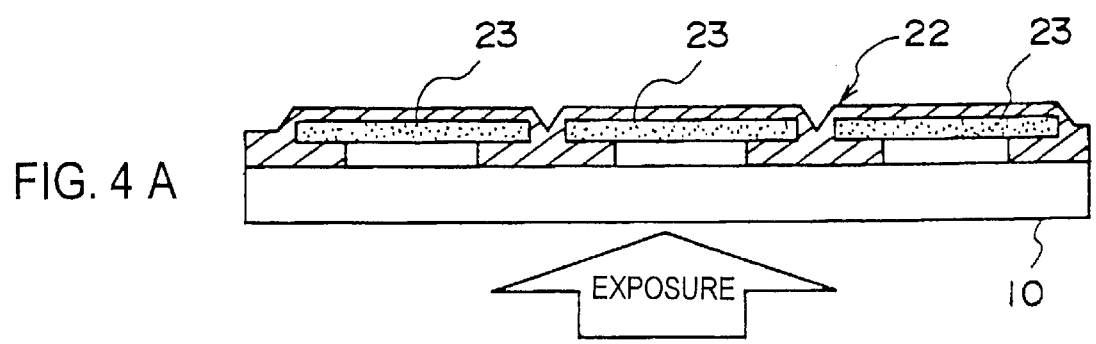
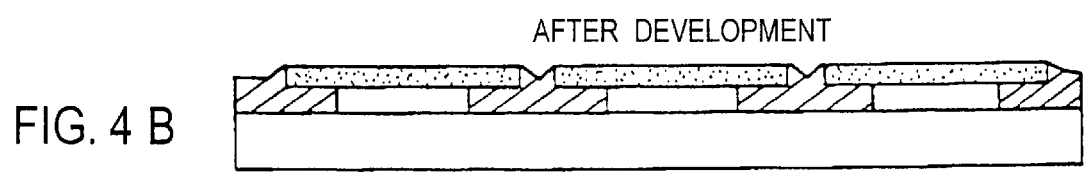
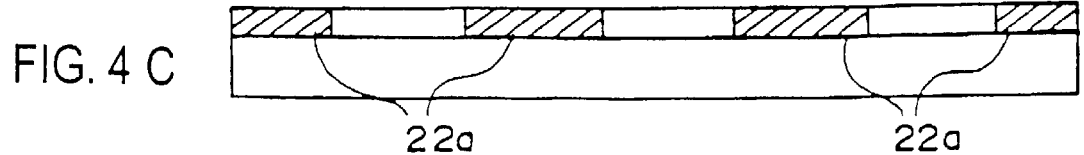
FIG. 4 A
FIG. 4 B
FIG. 4 C FIG. 5A
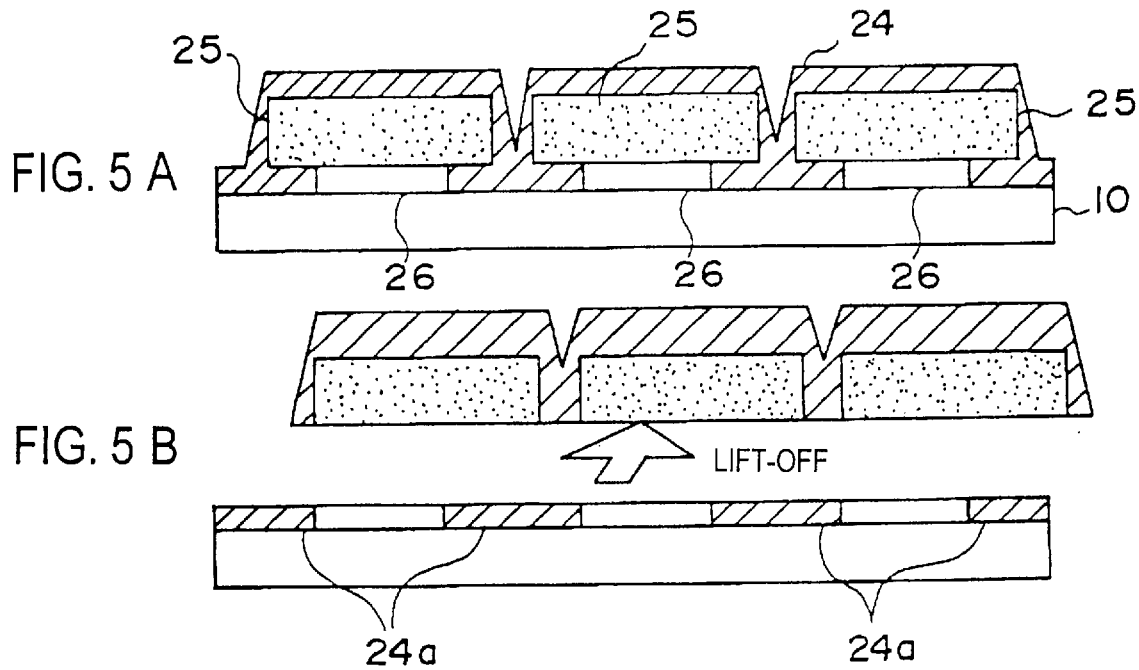
FIG. 5B
FIG. 6
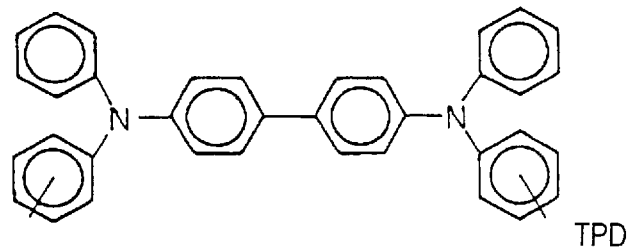
TPD
FIG. 7
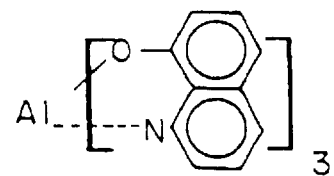
tris(8-hydroxyquinoline)aluminium thiophene rubrene 4,4',-bis[(1,2,2-triphenyl)ethenyl]-biphenyl

ORGANIC ELECTROLUMINESCENT DEVICE, AND ITS FABRICATION METHOD

This appln is a continuation of PCT/JP98/01652 filed Apr. 10, 1998.

TECHNICAL FIELD

The present invention relates to an organic electroluminescent device used as a light source for displays, etc., and a method of fabricating the same.

BACKGROUND TECHNIQUE

An organic EL display using an organic electroluminescent (hereinafter called an organic EL) device has some advantages over a liquid crystal display that is a flat panel display currently in vogue in the field of display equipment, as indicated below.

(1) The organic EL device emits light spontaneously and so ensures a wide field angle.

(2) Thin type display equipment having a thickness of about 2 to 3 mm can be easily fabricated.

(3) The organic EL device can emit natural colors because of no need of using any polarizing plate.

(4) Clearer displays than ever before can be obtained because of a wide dynamic range for brightness.

(5) The organic EL device can operate over a wide temperature range.

(6) The organic EL device can present an easy display of dynamic images because its response speed is at least triple-digit faster than that of a liquid crystal device.

Regarding an organic EL device having such excellent features, however, it has so far been indicated that a problem arises in conjunction with reliability when it is used over an extended period of time. In particular, it is known that spots incapable of emitting light, called dark spots, occur on a light-emitting display surface of the organic EL device. The dark spots are responsible for luminance drops and, hence, image quality drops. A transparent conductive film such as an electrode film (often an indium tin oxide or ITO film, and hereinafter called the first electrode) is formed on a substrate. The dark spots are likely to occur on particles present on the first electrode. Usually, the first electrode is provided in an array form comprising a plurality of electrode elements, between which there is a step. The dark spots are also likely to occur from the step, because the ability of an organic film to cover the step is less than satisfactory.

At the step between the first electrode elements, electric field concentration is not only likely to occur but the organic film is also likely to become thin. It is then observed that these are combined with each other to cause much stronger light to be emitted at the step area rather than at a flat area in the first electrode array at an initial stage of light emission. It is also often observed that, with the lapse of time, the dark spots and interelectrode short circuiting are likely to occur at the step area in the first electrode array.

This phenomenon is due to a structural problem inherent in an organic EL device. Thus, some approaches to covering the step area in the first electrode array with an insulating film have been proposed so far in the art, as disclosed in JP-A's 3-250583, 3-274694 and 4-51494. A typical approach is explained just below.

A transparent conductive or ITO film is formed as a first electrode on a substrate as by a sputtering process, followed by patterning the ITO film into a given shape by photolithography. Then, an insulating film such as an $SiO_2$ film is formed all over the surface of the substrate, and a portion of the ITO film to emit light is exposed by photolithography. Following this, an organic film including a light-emitting layer is formed. Finally, a metal film composed mainly of Mg, for instance, is formed as a second electrode to oppose to the first electrode and be formed on the organic layer. The thus formed organic EL device has such architecture as illustrated in FIG. 1.

However, this approach has the following problem. As can be seen from FIG. 1, when an insulating film 3 to cover a step in an ITO film (the first electrode) 2 formed on a substrate 1 is patterned by photolithography, it is required to preset an alignment margin for photolithography. Accordingly, the covering insulating film 3 is formed on the ITO film 2. However, the portion of the insulating film 3 formed on the ITO film 2 makes no contribution to light emission and, consequently, the area of the portion that actually emits light (hereinafter called the effective light-emitting area) is decreased as compared with the area of the ITO film 2. When a product is produced using a glass substrate of large size where at least one side is in the 300 mm class or more, the alignment margin needed for a projection aligner that has a high throughput yet is inexpensive is usually at least 5 µm. Accordingly, when a high-density yet compact display capable of displaying TV pictures in particular is produced, a decrease in the display area due to this alignment margin is as large as 10% or greater.

There is also a step in the insulating film 3 itself. Stress is likely to occur in portions of an organic layer 4 and a metal layer 5 that go over this step or in a protective layer (not shown) formed after the formation of these layers. With the occurrence of stress, an area including the organic layer 4 in direct contact with the ITO film 2 and the metal electrode formed thereon, i.e., a light-emitting area delaminates or otherwise fails. As a result, it is observed through the inventors' experimentation that the probability of occurrence of non-emitting spots such as dark spots becomes high.

The larger the effective light-emitting area, the better the image quality is, and so it is clearly desired to obtain a large effective light-emitting area. When an organic EL device having such a large effective light-emitting area is used to obtain the same amount of light emission as that obtained with an organic EL device having a small effective light-emitting layer, the service life of the former organic EL device is increased because the voltage supplied thereto can be lowered.

Thus, the aforesaid conventional approach involves an essential problem in conjunction with the fabrication of a display that has high reliability and is capable of high-luminance displays.

How to reduce a step in the formation of thin films has already been investigated in the fabrication process of VLSI (large scale integrated) semiconductor products represented by mass-storage DRAMs (dynamic random access memories). This is inevitably required in view of the hyper-fine structure inherent in VLSIs. In a VLSI, as a thin film pattern becomes finer, there is a portion where step width is substantially equal to, or larger than, the pattern width. Unless such a step is filled up with an insulating film, it is then known that interconnecting lines formed on the misalignment have breaks or other failures. For a technique for filling up and thereby eliminating such a step, for instance, frequent use is made of CVD (chemical vapor deposition) process, and a CMP (chemo-mechanical polishing) process where an insulating thin film composed mainly of $SiO_2$ by a SOG (spin-on-glass) process is subjected to chemo-mechanical polishing or an etching-back process wherein this insulating thin film is etched back by dry-etching.

However, when these processes are applied to the fabrication process of organic EL displays to eliminate a step in the first electrode, such problems as mentioned just below arise. With the chemo-mechanical polishing process, there is a possibility of causing minute damage to the surface of the first electrode. With flaws in the surface of the first electrode, the light emission life of an organic EL device becomes short, possibly with the occurrence of dark spots. With the etching-back process by dry-etching, it is difficult to achieve uniform etching, resulting in the occurrence of an area where a corner of the misalignment in the first electrode is exposed. As a matter of course, thickness variations in the formation of the insulating film to be etched back are superposed on etching fluctuations.

Thus, it is found that the direct application of processes used so far in the fabrication process of VLSI semiconductor products have some problems. It is also found that the direct application of such processes, if not impossible, is difficult.

JP-A's 8-171989, 9-134787 and 9-161970 provide a disclosure about the formation of an insulating film similar in thickness to a transparent conductive electrode. However, the processes disclosed therein are a process having some influences on the transparent conductive electrode, a process wherein the insulating film formed is uneven in the plane of the substrate, and a process that is in principle very difficult to achieve. Further, the specifications fail to provide a disclosure of how such processes are actually carried out.

DISCLOSURE OF THE INVENTION

An object of the present invention is to prevent the occurrence of deficiencies that are likely to be found in a step in a first electrode array formed on the substrate side of an organic EL display by use of a method different from conventional methods, and improve the image quality and reliability of the organic EL display by increasing the effective light-emitting area.

Such an object is achieved by the inventions defined below as (1) to (9).

(1) An organic electroluminescent device comprising:
a light-transmitting substrate,
a first electrode array of transparent electrodes formed on said substrate and separated from each other,
an insulating film formed on a side of said transparent electrodes and having substantially the same thickness as said transparent electrodes,
a light-emitting layer formed on said transparent electrodes, and
a second electrode array of electrodes formed on said light-emitting layer in opposition to said first electrode array.

(2) An organic electroluminescent device according to (1), which further comprises a color filter on said light-transmitting substrate, said color filter having said first electrode array thereon.

(3) A method of fabricating an organic electroluminescent device by:
forming a transparent electrode on a light-transmitting substrate,
forming on a side of said transparent electrode an insulating layer having substantially the same thickness as said transparent electrode, and
forming a light-emitting layer and a second electrode on said transparent electrode.

(4) A method of fabricating an organic electroluminescent device by:
forming a transparent electrode on a light-transmitting substrate,
forming on said transparent electrode an etching-resistant film that is resistant to an etching material for said transparent electrode,
over-etching and thereby patterning said transparent electrode so that said etching-resistant film overhangs said transparent electrode,
coating an insulating film so that said insulating film is further formed on an over-etched portion of said transparent electrode, and
removing said insulating film and said etching-resistant film so that only a portion of said insulating layer formed on a side of said transparent electrode remains.

(5) The method of fabricating an organic electroluminescent device according to (4), wherein a flattening film remaining on the side of said electrode has substantially the same thickness of said electrode.

(6) A method of fabricating an organic electroluminescent device by:
forming an electrode on a substrate,
forming a combined flattening and leveling film on said electrode,
over-etching and thereby patterning said electrode so that said flattening and leveling film overhangs said electrode,
coating a flattening film so that said flattening film is further formed on an over-etched portion of said electrode, and
removing said flattening film and said flattening and leveling film so that only a portion of said flattening film formed on a side of said electrode remains.

(7) The method of fabricating an organic electroluminescent device according to (6), wherein said flattening film remaining on the side of said electrode has substantially the same thickness of said electrode.

(8) A method of fabricating an organic electroluminescent device by:
forming an electrode on a light-transmitting substrate,
forming a combined flattening and leveling film on said electrode,
over-etching and thereby patterning said electrode so that said flattening and leveling film overhangs said electrode,
carrying out heat treatment so that an overhanging portion of said leveling film bends away from said substrate,
coating a flattening film after said heat treatment so that said flattening film is further formed on an over-etched portion of said electrode, and
removing said flattening film and said flattening and leveling film so that only a portion of said flattening film formed on a side of said electrode remains.

(9) The method of fabricating an organic electroluminescent device according to (8), wherein said flattening film remaining on the side of said electrode has substantially the same thickness of said electrode.

EFFECT OF THE INVENTION

As explained above in detail, an organic EL display panel using the organic EL device of the invention, because of having a large effective light-emitting area, is more excellent in image quality than a conventional organic EL display panel. In addition, the step in the ITO film used for the first electrode array is so reduced or eliminated that the occurrence of dark spots from such a mis-alignment can be prevented. It is thus possible to fabricate a high-reliability flat panel display.

BRIEF EXPLANATION OF THE DRAWINGS

FIGS. 3A, 3B and 3C show steps of forming the mis-alignment-flattened structure in the organic EL device according to Embodiment 1 of the invention, using a positive photosensitive resin.

FIGS. 4A, 4B and 4C shows steps of forming the mis-alignment-flattened structure in the organic EL device according to Embodiment 1 of the invention, using a negative photosensitive resin.

FIGS. 5A and 5B show steps of forming the mis-alignment-flattened structure in the organic EL device according to Embodiment 1 of the invention, using a lift-off process.

FIG. 6 is a chemical structural formula of N,N'-bis(m-methyl phenyl)-N,N'-diphenyl-1,1'-biphenyl-4,4'-diamine.

FIG. 7 is a chemical structural formula of tris(8-hydroxyquinoline)aluminum.

BEST MODE OF CARRYING OUT THE INVENTION

The organic electroluminescent device according to the present invention is characterized by comprising a light-transmitting substrate, a transparent electrode formed on the substrate, an insulating film formed on a side of the transparent electrode and having the same thickness as the transparent electrode, and a light-emitting layer formed on the transparent electrode.

Embodiments of the present invention will now be explained in detail with reference to the drawings.
EMBODIMENT 1

The essence of the problem with the conventional method is the presence of a step in a first electrode array of hole-injecting electrodes. To solve this problem, the step should be removed by flattening or leveling the first electrode array of the organic electroluminescent (EL) device. A structure freed of the step by flattening the first electrode array may be obtained by forming on the side of the first electrode pattern an insulating layer having quite the same thickness as the first electrode array. Hereinafter, such a structure will be called the step-flattened structure.

The step-flattened structure of the first electrode array may be obtained by the following method. While reference is here made to an organic EL display fabricated using an organic EL device wherein an ITO ($In_2O_3$—$SnO_2$) film is used for the first electrode array, it is understood that the first electrode array is not limited to the ITO film; that is, an $In_2O_3$—ZnO, $SnO_2$ or ZnO film may be used for the first electrode array.

Figure 1:
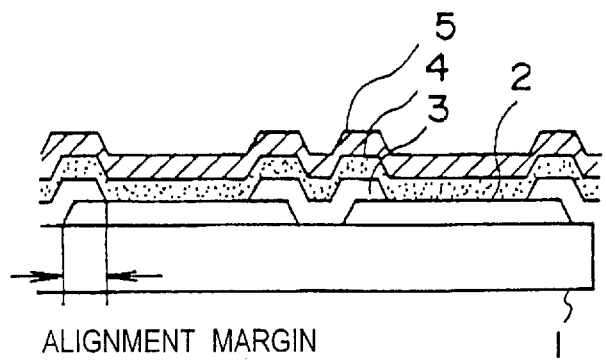
FIG. 1 is a sectional schematic of a conventional electroluminescent (EL) device where a step in an ITO film used as a first electrode array is covered with an insulating film.
Figure 2A:
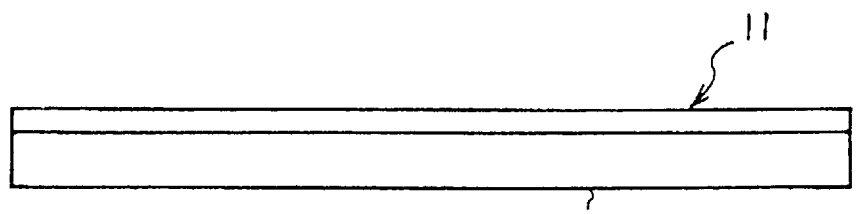
FIGS. 2A, 2B, 2C, 2D, 2E, 2F and 2G show steps of forming a step-flattened structure in an organic EL device according to Embodiment 1 of the invention.

(1) Using an appropriate process such as a sputtering or deposition process, an ITO film 11 is formed on a light-transmitting substrate 10 such as a glass substrate (see FIG. 2A). The film thickness is of the order of 10 to 500 nm.

Figure 2B:
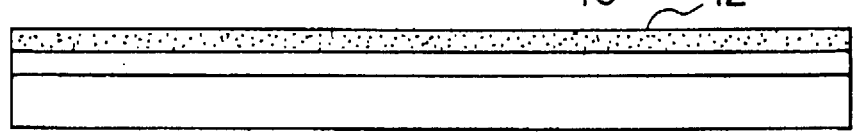

(2) After the formation of the ITO film 11, at least one thin film or resin layer (hereinafter called a combined flattening and leveling film 12) is formed thereon (see FIG. 2B). The thin film or resin layer is not attacked by an etchant used for etching of the ITO film 11 at the subsequent step (an etching solution in wet-etching, and an etching gas in dry-etching) and less susceptible to etching. The flattening and leveling film 12 has a thickness of the order of 50 to 1,000 nm.

Figure 2C:
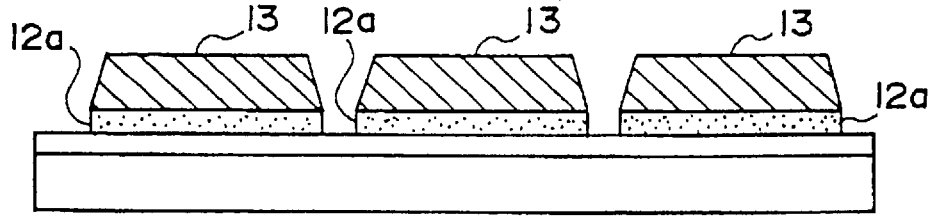

(3) A photosensitive resin 13 such as a photoresist is selectively coated on the flattening and leveling film 12. Then, the flattening and leveling film 12 is patterned into a desired shape using the coated photosensitive resin 13, thereby forming a combined flattening and leveling film 12a (see FIG. 2C).

Figure 2D:
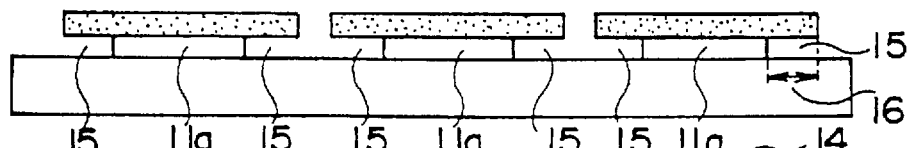

(4) After the formation of the flattening and leveling film 12a, the ITO film 11 is over-etched to form an ITO film 11a, thereby providing a sufficient undercut portion 15 beneath the flattening and leveling film 12a. The undercut portion 15 has a given undercut length 16. Then, the photosensitive resin 13 used for the patterning of the flattening and leveling film 12 is removed (see FIG. 2D). The pattern of ITO films 11 and 11 is of the order of 30 µm to 1,000 µm, with a spacing of the order of 5 to 1,000 µm between the ITO films 11. The undercut length is of the order of 0.1 to 5 µm.

(5) After removal of the photosensitive resin 13, an insulating film 14 such as a resin or SOG (spin-on-glass) film (hereinafter called a flattening film) is formed by a coating process (see FIG. 2E). The coating process enables every gap to be impregnated with a coating (insulating) material, so that the undercut portion 15, too, can be filled with the insulating film.

When the photosensitive resin 13 is not dissolved in a solvent for the flattening film 14, it is acceptable to form the flattening film 14 before removal of the photosensitive resin 13. In this case, however, it is required that the flattening film 14 be not attacked by a stripping solution for the photosensitive resin 13. It is here to be noted that it is acceptable to remove the photosensitive resin 13 before the ITO film 11 is etched, because the etching-resistant material that can be resistant to the etchant used for the etching of the ITO film 11 is used for the flattening and leveling film 12.

Figure 2E:
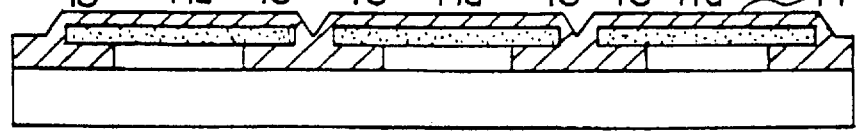
Figure 2F:
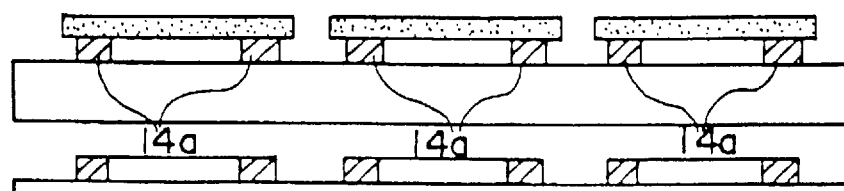
Figure 2G:
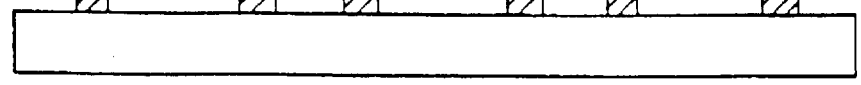

(6) After the formation of the flattening film 14 as illustrated in FIG. 2E, a large part of the flattening film (including the insulating film) on the flattening and leveling film 12a is removed, thereby forming an insulating film (material) 14a (see FIG. 2F). Further removal of the flattening and leveling film 12a enables the insulating film 14a formed in the undercut portion 15 to remain at the same thickness as the ITO film 11a (see FIG. 2G).

The flattening film 14 may be removed by use of an etching-back process by dry-etching. When the flattening film 14 is removed by wet-etching, the etching time should preferably be such that the undercut length becomes sufficiently long as compared with the thickness of the insulating film 14a so that sufficient etching can occur in the thickness direction of the insulating film 14a (or in the direction vertical to the substrate 10), but insufficient etching can occur in the full lengthwise direction of the undercut (or in the direction parallel with the substrate 10).

In the present invention, it is acceptable to use a positive photosensitive resin for a flattening film 20 and use for a combined flattening and leveling film 21 a thin film that can cut off light having a wavelength, to which at least the positive photosensitive resin is sensitive. In this case, it is possible to coat the positive photosensitive resin on a substrate 10, exposing the photosensitive resin to light from its side that faces away from the substrate 10, and developing the photosensitive resin (see FIG. 3A), whereby the positive photosensitive resin is removed to allow an insulating film (insulating material) 20a that is an unexposed portion of the positive photosensitive resin to remain only in the undercut portion hidden by the leveling film 21 (see FIG. 3B). Thereafter, the flattening and leveling film 21 should preferably be removed (see FIG. 3C).

It is also acceptable to use a negative photosensitive resin for a flattening film 22 and use for a combined flattening and leveling film 23 a thin film that can cut off light having a wavelength, to which at least the negative photosensitive resin is sensitive. It is then possible to coat the negative photosensitive resin on a light-transmitting substrate 10 and then exposing the photosensitive resin to light from its side that faces away from the substrate 10 (see FIG. 4A), whereby the negative photosensitive resin formed on the flattening and leveling film 23 is removed upon development (see FIG. 4B). Thereafter, the flattening and leveling film 23 should preferably be removed (see FIG. 4C), thereby forming an insulating film (insulating material) 22a.

It is here to be noted that after removal of the leveling film 23, the insulating film 22a having an asperity in its surface is left in an actual case. However, the size of the asperity is much smaller than the thickness of a step in the first electrode array of a conventional organic EL device, and so the asperity is negligible in the present invention. Thus, such an asperity is not illustrated in FIG. 4C.

As mentioned above, the step-flattened structure according to the invention may be obtained by removal of an unnecessary flattening film that is not contiguous to the side wall of the ITO film, followed by removal of the flattening and leveling film.

Alternatively, a combined flattening and leveling film 25 thicker than an ITO film 26 is first formed, and a flattening film 24 is then formed in such a manner that its thickness is smaller than that obtained by adding the thickness of the flattening and leveling film 25 to the thickness of the ITO film 26 (see FIG. 5A). Following this, the flattening and leveling film 25 is removed simultaneously with the flattening film 24 formed on the flattening and leveling film 25, etc. by means of a lift-off process (see FIG. 5B), so that an insulating film 24a can be formed.

It is here to be noted that after simultaneous removal of the flattening and leveling film 25 and flattening film 24 by the lift-off process, the insulating film 24a having an asperity in its surface is left in an actual case. As mentioned above, however, the size of the asperity is much smaller than the thickness of a step in the first electrode array of a conventional organic EL device, and so the asperity is negligible in the present invention. Thus, such an asperity is not illustrated in FIG. 5B.

An organic film including a light-emitting layer is formed on the first electrode (ITO film) that is thus flattened at the end of the pattern. Then, a second electrode film is formed on the organic film to fabricate an organic EL display in which the organic EL device of the invention is used.

A specific example of fabricating an organic EL display in which the organic EL device of the invention is used is given below. That is, set out below is a specific example of fabricating a dot matrix type organic EL display having 256×128 dots constructed with a pixel size of 0.30 mm×0.30 mm, using a novolak resin type positive resist for a flattening film.

First, an inexpensive soda glass substrate is chosen as a substrate used to fabricate an organic EL display. The glass substrate is coated with silica all over the surface. This silica coating is to prevent sodium from migrating from the soda glass substrate upon heated, thereby protecting the glass substrate sensitive to acids or alkalis and improving the surface flatness of the glass substrate.

Then, a transparent conductive film or ITO film is provided on the glass substrate by a sputtering process to form a first electrode of 100 nm in thickness. The reason the ITO film is here used is that it provides a transparent conductive film superior to that obtained using other material. However, it is understood that other transparent conductive film such as a ZnO or $SnO_2$ film, too, may be used if no problem arises in conjunction with its transmittivity or resistivity. Although the sputtering process is suitable for the formation of a large-area film because of being particularly excellent in film uniformity, and in film quality and productivity as well, yet the ITO film may be formed by other process such as an evaporation process.

After the formation of the ITO film, a TiN (titanium nitride) film of 50 nm in thickness is formed as a combined flattening and leveling film. A resist pattern is formed on the TiN film by photolithography, and an unpatterned portion of the TiN film is then etched out with a commercially available etching solution comprising a 1:16 mixture of ammonia and hydrogen peroxide water (hereinafter called APM). Further, the ITO film is etched with a hydrochloric acid type etching solution.

The ITO film used herein has been formed under such film-forming conditions as to ensure that the period of time needed for etching out a 100 nm thick film is about 90 seconds. The ITO film is etched for a total time of 10 minutes in which the over-etching time is included, thereby obtaining an undercut portion beneath the TiN film pattern. This undercut portion has an undercut length of about 600 nm.

After the drying of the glass substrate, the resist is stripped off.

While the TiN film is used as the flattening and leveling film, it is understood that use may be made of any desired thin film if it is capable of cutting off light and less susceptible to etching with an ITO etching solution, and prevents an attack by an etching solution on an ITO film. Examples of such a film are a film composed mainly of Cr, and a film composed mainly of Ti.

Subsequently, a negative photosensitive polyimide is coated all over the surface of the TiN film to form a flattening film thereon. Then, the flattening film is prebaked at 80° C. for 30 minutes, exposed to ultraviolet light from the back side of the substrate at an exposure intensity of 10 $mW/cm^2$ for 30 seconds, and developed with an aqueous methanol solution. After the polyimide has been full-cured at 350° C. for 1 hour, TiN is removed by use of APM.

Figure 13:
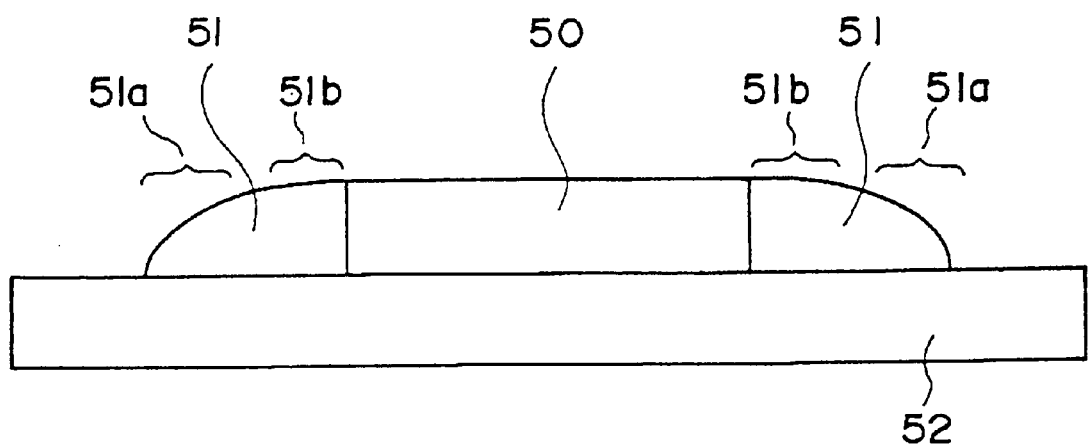
FIG. 13 is an illustration of how an insulating film on the side of an ITO film is formed according to Embodiment 1 of the invention.

Referring here to FIG. 13, an insulating film 51 of polyimide, etc. remaining on the side of an ITO film 50 on a substrate 52 upon curing undergoes a little shrinkage. For this reason, a portion 51a of the insulating film located farther off the side of the ITO film 50 becomes thin, but a portion 51b thereof contiguous to the side of the ITO film 50 has substantially the same thickness as the ITO film 50.

Figure 14:
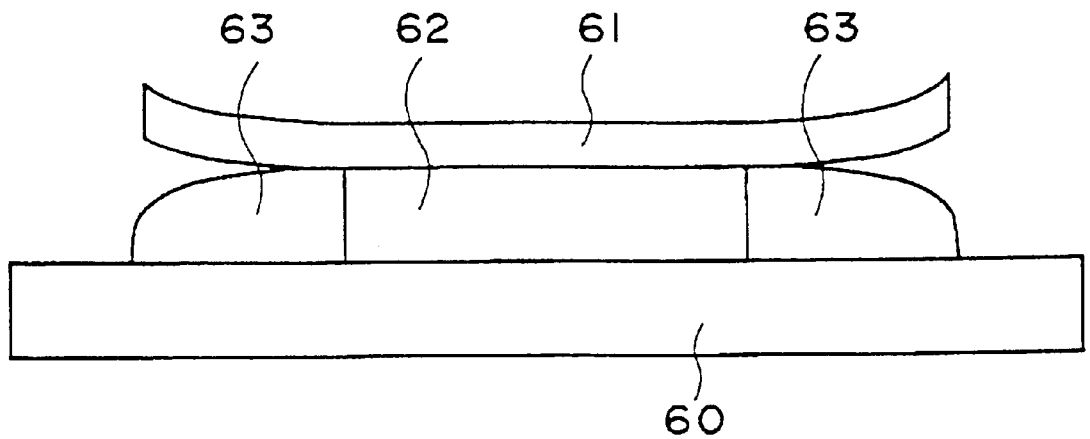
FIG. 14 is an illustration of how the insulating film on the side of the ITO film is formed according to Embodiment 1 of the invention.

If, in FIG. 14, a substrate 60 is heated to about 100° C. before the formation of a flattening film to increase the tensile stress of an TiN film 61 formed on an ITO film 62, an overhanging portion of the TiN film 61 above an undercut portion then slightly curls up, so that it bends away from the substrate 60. Therefore, if the flattening film is formed after such heat treatment to form an insulating film 63 on the side of the ITO film 62, the thickness decrease of a portion of the insulating layer 63 spaced away from the side of the ITO film 62 is more reduced as compared with the insulating film 51 shown in FIG. 13.

In this way, there is obtained the step-flattened structure of the invention wherein the insulating film having the same thickness as the first electrode is formed on the side of the first electrode.

Then, N,N'-bis(m-methyl phenyl)-N,N'-diphenyl-1,1'-biphenyl-4,4'-diamine (hereinafter called TPD, and see FIG. 6) serving as hole injecting and transporting layers in an organic EL device including a light-emitting layer, tris(8-hydroxyquinoline)aluminum (hereinafter called $Alq^3$, and see FIG. 7) serving as a combined light-emitting and electron-transporting layer, and an Mg/Ag alloy (at a weight ratio of 10:1) serving as a second electrode are continuously deposited in vacuum and without exposure to the air, each at a thickness of 50 nm.

The present invention is in no sense limited to the constituting films of the organic EL device and the order of lamination thereof, used in Embodiment 1. For the hole-injecting layer, light-emitting layer, and second electrode, other materials may be used. In addition, a multilayer structure further comprising an additional hole-injecting layer, electron-transporting layer, electron-injecting layer, etc. may be used. That is, the present invention may be applied to any desired structure irrespective of the type and structure of material formed into film.

Subsequently, a sputtering process is used to form an Al film of 200 nm in total thickness in vacuum and without exposure to the air for the purpose of protecting the electron-injecting electrode of the Mg/Ag film.

To form a pattern comprising the Al film and the Mg/Ag film, a resist pattern is formed using a rubber type negative resist, followed by dry-etching. This dry-etching is carried out by an RIE (reactive ion etching) process at a power input of 2,000 W and a gas pressure of 100 mTorr. For the etching gas, $Cl_2$ and $BCl_3$ are used.

After this dry-etching, ashing treatment is carried out in vacuum and without exposure to the air. This is to prevent corrosion of Al occurring after the dry-etching, which is referred to as an after-corrosion. It is here to be noted that the resist pattern, too, is removed by this ashing treatment.

Finally, an $SiO_2$ protective film is formed by a sputtering process to bring an organic EL device to perfection. In an organic EL display fabricated using the thus obtained organic EL device, it is found that no dark spots occur and grow at the ends of the ITO film pattern and, hence, high reliability is achieved.

EMBODIMENT 2

Given below is an example of fabricating a simple matrix type organic EL display having a dot size of 50 $\mu$m wide and 150 $\mu$m long with 256×3 (RGB) ×192 dots. As compared with Embodiment 1, Embodiment 2 is designed to be capable of multicolor light emission by the formation of color filters, presenting ever finer images. The size of the glass substrate used for display fabrication is 300×400 mm, so that 64 display panels can be obtained.

First, Corning #7059 glass made by Corning is used as a substrate 30. According to the most commonly available procedure to achieve color displays, a pigment dispersion type color filter is coated on the substrate 30. After this, patterning is carried out under film-forming conditions selected such that filters corresponding to RGB (red, green, and blue) are formed at thicknesses of 1.5 to 2.2 $\mu$m.

For instance, the step of forming a red filter by coating is carried out as follows. After a 5-second spin coating of a red filter solution at 1,000 rpm (revolutions per minute), the coating is prebaked on a 100° C. hot plate for 3 minutes. Upon photomask alignment, the prebaked coating is exposed to ultraviolet light of 20 mW/cm$^2$ for 30 seconds using an aligner, followed by development of the exposed coating using an aqueous solution of TMAH at a concentration of about 0.1%. The development time is about 1 minute. While the dissolution of the coating in a filter solution of other color (green or blue) coated at the subsequent step is prevented, the coating is (thermally) cured at 220° C. for 30 minutes, thereby forming a red filter (pattern) 31 (see FIG. 8A).

Figure 8:
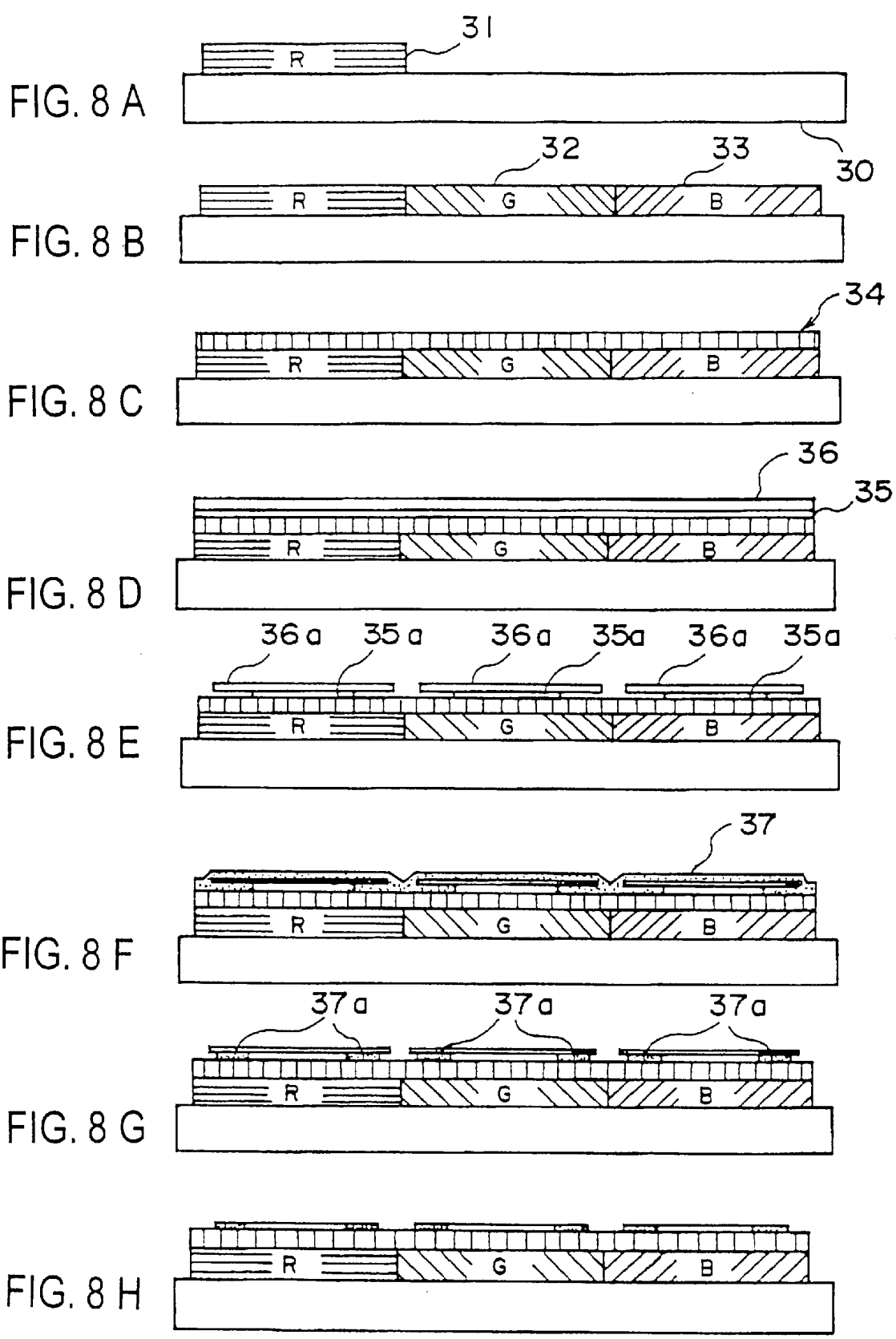
FIGS. 8A, 8B, 8C, 8D, 8E, 8F, 8G and 8H show steps of forming a step-flattened structure in an organic EL device according to Embodiment 2 of the invention.

Color filters 32 and 33 of other colors (green, and blue) should be formed by a step substantially similar to the aforesaid step (see FIG. 8B). However, it is here to be noted that details of the forming conditions used in this case are different from those used for the formation of the red color filter 31 because of a difference between the materials (pigments) used. While this example is directed to an organic EL display with only the color filters added thereto because of the relative ease with which it is fabricated, yet it is acceptable to use a fluorescent conversion filter so that green, and red can be emitted upon color conversion, thereby achieving light emission with higher luminance. It is also acceptable to laminate a fluorescent conversion filter on color filters, thereby making a reasonable tradeoff between a luminance decrease and a color purity improvement.

Then, an overcoating material 34 is coated on the color filters 31, 32 and 33 to improve the flatness of a surface on which an ITO film is formed at the subsequent step, and cured at 220° C. for 30 minutes (see FIG. 8C), as mentioned above. The overcoating material is preferably a resin.

Subsequently, a transparent conductive film or ITO film 35 is formed by a sputtering process at a thickness of 100 nm to form a first electrode. Following this, a TiN (titanium nitride) film 36 is formed at a thickness of 50 nm to form a combined flattening and leveling film (see FIG. 8D).

After selective formation of a resist pattern on the TiN film 36 by photolithography, an unpatterned portion of the TiN film 36 is etched out by use of the aforesaid APM, followed by etching of the ITO film 35 with a hydrochloric acid type etching solution. One hundred (100) seconds are needed to etch out the 100 nm-thick ITO film 35 used herein. However, etching is carried out for 10 minutes, whereby an undercut portion having an undercut length of about 600 nm and an ITO film 35a are formed beneath a TiN film 36a. Following this, the resist is stripped off after drying of the substrate 30 (see FIG. 8E).

Subsequently, a positive resist is coated as a flattening film 37 (see FIG. 8F), prebaked at 110° C. for 90 seconds, exposed to ultraviolet light at an exposure intensity of 10 mW/cm$^2$ for 10 seconds, and developed with an aqueous solution of TMAH (see FIG. 8G).

The resist is cured at 180° C. for 1 hour in an oven, and the TiN film 36a is removed by use of the aforesaid APM. Upon curing, the resist undergoes a little shrinkage, but a leveling film 37a contiguous to the ITO film 35a has the same thickness as the ITO film 35a.

In this way, the ITO film (the first electrode) freed of the step and thereby flattened is formed (see FIG. 8H).

An organic layer and a second electrode provided on the ITO film are formed by shaping the following materials into films. In Embodiment 2, use is made of an organic EL material that emits white light.

Figure 9:
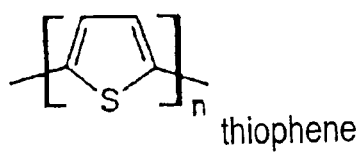
FIG. 9 is a chemical structural formula of poly(thiophene-2,5-diyl).
Figure 10:
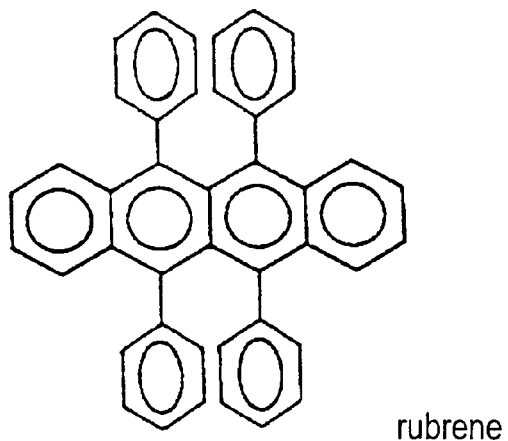
FIG. 10 is a chemical structural formula of rubrene.
Figure 11:
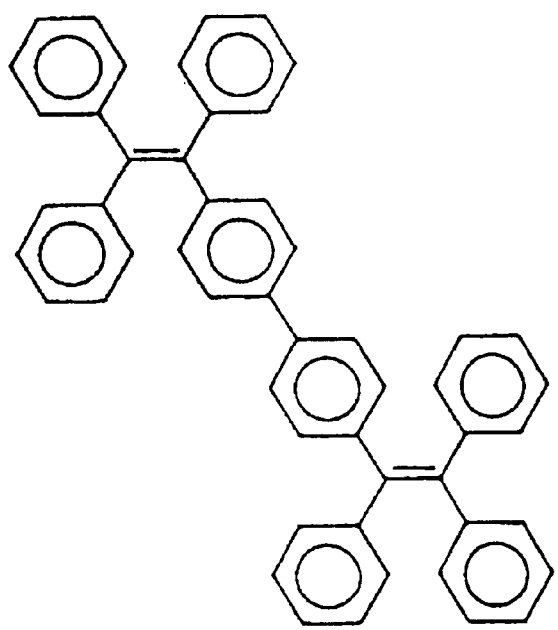
FIG. 11 is a chemical structure formula of 4,4'-bis[(1,1,2-triphenyl)ethenyl]-biphenyl.
Figure 12:
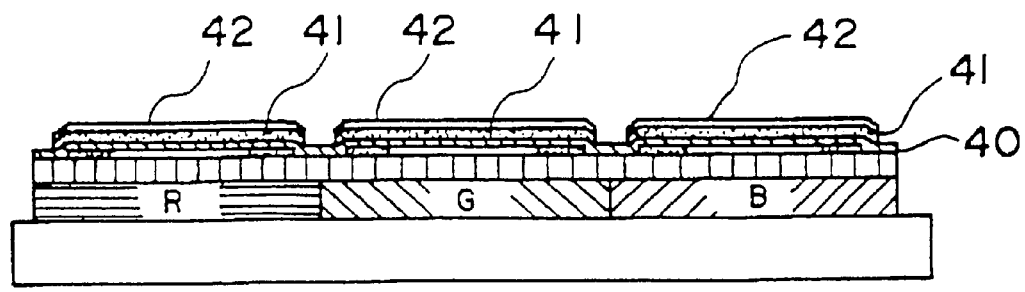
FIG. 12 is a sectional schematic of a color simple matrix type organic EL display fabricated through steps according to Embodiment 2 of the invention.

For a hole-injecting layer poly(thiophene-2,5-diyl) (see FIG. 9) is deposited at a thickness of 10 nm, and for a combined hole-injecting and yellow light-emitting layer TPD (see FIG. 6) doped with 1% by weight of rubrene (see FIG. 10) is co-deposited at a thickness of 50 nm. The concentration of rubrene is preferably between about 0.1% by weight and about 10% by weight, at which light emission is obtained with high efficiency. While the concentration of rubrene is preferably determined by a color balance between emitted colors, it is understood that the concentration of rubrene varies depending on the intensity and wavelength spectra of light emitted out of the blue light-emitting layer to be subsequently formed. For a blue light-emitting layer 4,4'-bis[(1,1,2-triphenyl)ethenyl]-biphenyl (see FIG. 11) is deposited at a thickness of 50 nm, for an electron-transporting layer $Alq^3$ at a thickness of 10 nm, and for a second electrode an Mg/Ag alloy film (at a weight ratio of 10:1) at a thickness of 200 nm. It is here to be noted that these layers should be continuously deposited in vacuum and without exposure to the air. In this way, an organic layer 40 is formed as illustrated in FIG. 12.

Subsequently, an Al film 41 and an $SiO_2$ film 42 are formed by a sputtering process in vacuum and without exposure to the air. In connection with the formation of the $SiO_2$ film 42, it is noted that a taking electrode portion (not shown) is previously covered with a metal mask or the like so as to prevent formation of the insulating $SiO_2$ film on the taking electrode portion.

In this way, a color simple matrix type organic EL display is fabricated. In this regard, the thus obtained organic EL display has an effective light-emitting area of 87.0% that is much larger than an effective light-emitting area of 67.7% obtained when an edge portion of the first electrode is covered with an insulating film of about 5 μm. From this, it is found that the present invention makes it possible to obtain an organic EL display much brighter than a conventional organic EL display.

The present invention is not limited to the aforesaid embodiments, and so may be subjected to various modifications within the purport of the invention.

While Embodiment 2 has been described with reference to a simple matrix type organic EL display, it is understood that the present invention may also be applied to an active matrix type organic EL display. Further, the organic EL display of the present invention is also applicable to products in the field wherein liquid crystal displays may be utilized. Furthermore, the organic EL device of the present invention is applicable to a head portion of a printer as an example.

I claim:

1. An organic electroluminescent device comprising:

a light-transmitting substrate, a first electrode array of transparent electrodes formed on said substrate and separated from each other, a deposited insulating film formed on sides of said transparent electrodes, having substantially the same thickness as said transparent electrodes, insulating films on adjacent sides an adjacent pair of said electrodes being separated from each other, an organic layer including a light-emitting layer, formed on said transparent electrodes, and a second electrode array of electrodes formed on said organic layer in opposition to said first electrode array.

2. An organic electroluminescent device comprising:

a light-transmitting substrate, a first electrode array of transparent electrodes formed on said substrate and separated from each other, an a deposited insulating film formed on sides of said transparent electrodes and having substantially the same thickness as said transparent electrodes, an organic layer including a light-emitting layer, formed on said transparent electrodes, a second electrode array of electrodes formed on said organic layer in opposition to said first electrode array, and a color filter on said light-transmitting substrate, said color filter having said first electrode array thereon.

* * * * *